(12) United States Patent
  Shinohara

(10) Patent No.: US 10,944,931 B2
(45) Date of Patent: Mar. 9, 2021

(54) SOLID STATE IMAGING DEVICE AND IMAGING SYSTEM

(71) Applicant: CANON KABUSHIKI KAISHA, Tokyo (JP)

(72) Inventor: Mahito Shinohara, Tokyo (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 22 days.

(21) Appl. No.: 16/146,173

(22) Filed: Sep. 28, 2018

(65) Prior Publication Data

US 2019/0110013 A1    Apr. 11, 2019

(30) Foreign Application Priority Data

Oct. 5, 2017   (JP) .............................. JP2017-195154

(51) Int. Cl.
  *H04N 5/3745* (2011.01)
  *H01L 27/146* (2006.01)
  (Continued)

(52) U.S. Cl.
  CPC ........... *H04N 5/3745* (2013.01); *G01C 3/085* (2013.01); *H01L 27/14612* (2013.01);
  (Continued)

(58) Field of Classification Search
  CPC ...... H04N 5/3745; H04N 5/376; H04N 5/369; H04N 9/045; H04N 5/3698;
  (Continued)

(56) References Cited

U.S. PATENT DOCUMENTS 4,962,412 A    10/1990   Shinohara et al. ............ 136/252
5,008,206 A    4/1991    Shinohara et al. ............. 438/57
(Continued)

FOREIGN PATENT DOCUMENTS

CN    101534397 A    9/2009
CN    103529889 A    1/2014
(Continued)

OTHER PUBLICATIONS

Chinese Office Action dated Jan. 13, 2021 in counterpart Chinese application No. 201811153284.2 (with whole English language translation).

*Primary Examiner* — Quan Pham
(74) *Attorney, Agent, or Firm* — Venable LLP

(57) ABSTRACT

A solid state imaging device as an embodiment includes: a plurality of pixels each including at least one photoelectric conversion unit and an amplification transistor having a first input node electrically connected to the photoelectric conversion unit, a first primary node, and a second primary node; a transistor having a second input node, a third primary node, and a fourth primary node and having the same polarity as the amplification transistor; at least one signal line to which the first primary node of each of the plurality of pixels is electrically connected; and a current source electrically connected to the signal line, and a power source voltage is applied to the third primary node, the fourth primary node and the second primary node are electrically connected to each other, and the first primary node and the second input node are electrically connected to each other.

14 Claims, 9 Drawing Sheets

(51) Int. Cl.
*H04N 5/369* (2011.01)
*G01C 3/08* (2006.01)
*H04N 5/376* (2011.01)

(52) U.S. Cl.
CPC .. *H01L 27/14636* (2013.01); *H01L 27/14643* (2013.01); *H04N 5/3698* (2013.01); *H04N 5/376* (2013.01)

(58) Field of Classification Search
CPC ......... H01L 27/14612; H01L 27/14636; H01L 27/14643; G01C 3/085
See application file for complete search history.

(56) References Cited

U.S. PATENT DOCUMENTS

| | | | |
|---|---|---|---|
| 5,060,042 A | 10/1991 | Shinohara et al. | 257/290 |
| 5,086,326 A | 2/1992 | Shinohara et al. | 257/290 |
| 5,146,339 A | 9/1992 | Shinohara et al. | 348/301 |
| 5,280,358 A | 1/1994 | Yushiya et al. | 348/247 |
| 6,493,030 B1* | 12/2002 | Kozlowski | H04N 5/363 348/310 |
| 6,828,601 B2 | 12/2004 | Shinohara | 257/183.1 |
| 6,876,019 B2 | 4/2005 | Shinohara | 257/292 |
| 6,974,944 B2 | 12/2005 | Funakoshi et al. | 250/214 A |
| 7,250,970 B2 | 7/2007 | Shinohara | 348/308 |
| 7,394,492 B2 | 7/2008 | Shinohara | 348/301 |
| 7,476,837 B2 | 1/2009 | Koyama | 250/208.1 |
| 7,741,593 B2 | 6/2010 | Iwata et al. | 250/214 R |
| 7,821,551 B2 | 10/2010 | Shinohara | 348/241 |
| 7,884,870 B2 | 2/2011 | Shinohara | 348/300 |
| 8,063,966 B2 | 11/2011 | Shinohara | 348/308 |
| 8,139,133 B2 | 3/2012 | Iwane et al. | 348/308 |
| 8,164,668 B2 | 4/2012 | Iida et al. | 348/308 |
| 8,345,137 B2 | 1/2013 | Shinohara et al. | 348/308 |
| 8,350,942 B2 | 1/2013 | Shinohara | 348/308 |
| 8,471,942 B2 | 6/2013 | Shinohara | 348/308 |
| 8,896,734 B2 | 11/2014 | Shinohara | 348/294 |
| 8,970,769 B2 | 3/2015 | Shinohara et al. | 348/340 |
| 9,437,647 B2 | 9/2016 | Shinohara | H01L 27/14679 |
| 9,854,194 B2 | 12/2017 | Ni | H04N 5/3742 |
| 2005/0056675 A1 | 3/2005 | Kozlowski | |
| 2005/0253946 A1 | 11/2005 | Shinohara | 348/300 |
| 2013/0001650 A1* | 1/2013 | Ohtsuki | H01L 27/14603 257/225 |
| 2015/0341579 A1* | 11/2015 | Kobayashi | H01L 27/14601 348/302 |
| 2015/0349012 A1* | 12/2015 | Kobayashi | H01L 27/14609 250/208.1 |
| 2016/0071893 A1 | 3/2016 | Shinohara | 257/432 |
| 2016/0173856 A1* | 6/2016 | Naito | G01C 3/32 348/46 |
| 2018/0184027 A1 | 6/2018 | Shinohara | H01L 27/14607 |

FOREIGN PATENT DOCUMENTS

| | | |
|---|---|---|
| CN | 105304658 A | 2/2016 |
| JP | H05-63468 | 3/1993 |
| JP | 2003-259218 | 9/2003 |
| JP | 2008-042814 | 2/2008 |
| JP | 2008-193201 | 8/2008 |
| JP | 2010-056675 A | 3/2010 |
| JP | 2015-534407 | 11/2015 |

\* cited by examiner

SOLID STATE IMAGING DEVICE AND IMAGING SYSTEM

BACKGROUND OF THE INVENTION

Field of the Invention

The present invention relates to a solid state imaging device and an imaging system.

Description of the Related Art

A CMOS image sensor that is the mainstream as a solid state imaging device in recent years has a photodiode that accumulates signal charges in accordance with an incident light, an amplification transistor that outputs a signal voltage in accordance with the signal charges, and a constant current circuit that serves as a load of the amplification transistor. The gate of the amplification transistor forms a floating diffusion capacitor that converts signal charges of the photodiode into a signal voltage. The amplification transistor operates as a source follower and outputs a signal voltage of the floating diffusion capacitor with low impedance. In such an arrangement, reduction in the capacitance of the floating diffusion capacitor increases the amplitude of the signal voltage and can improve the signal-to-noise ratio in a signal processing unit in a post stage of pixels.

Japanese Patent Application Laid-Open No. 2008-42814 discloses a feedback circuit that feeds back a signal voltage output from an amplification transistor to the drain of the amplification transistor and thereby effectively reduces the capacitance between the gate and the drain of the amplification transistor.

SUMMARY OF THE INVENTION

A solid state imaging device according to one embodiment of the present invention includes: a plurality of pixels each including at least one photoelectric conversion unit and an amplification transistor having a first input node electrically connected to the photoelectric conversion unit, a first primary node, and a second primary node; a transistor having a second input node, a third primary node, and a fourth primary node and having the same polarity as the amplification transistor; a signal line to which the first primary node of each of the plurality of pixels is electrically connected; and a current source electrically connected to the signal line, and a power source voltage is applied to the third primary node, the fourth primary node and the second primary node are electrically connected to each other, and the first primary node and the second input node are electrically connected to each other.

A solid state imaging device according to another embodiment of the present invention includes: a plurality of pixels each including at least one photoelectric conversion unit and an amplification transistor having a first input node electrically connected to the photoelectric conversion unit, a first primary node, and a second primary node; a transistor having a second input node, a third primary node, and a fourth primary node and having the same polarity as the amplification transistor; a signal line to which the first primary node of each of the plurality of pixels is electrically connected; a current source electrically connected to the signal line; and a feedback circuit operated by a drive current supplied from the current source.

Further features of the present invention will become apparent from the following description of exemplary embodiments with reference to the attached drawings.

DESCRIPTION OF THE EMBODIMENTS

The feedback circuit disclosed in Japanese Patent Application Laid-Open No. 2008-42814 supplies a current not only to the amplification transistor but also to the constant current circuit. Thus, there is a problem of an increased consumption current of an imaging device.

A technology described below relates to an art that reduces a consumption current of an imaging device.

Embodiments of the present invention will be described below. Each of solid state imaging devices according to the first to fifth embodiments has a plurality of pixels, each of which has a photoelectric conversion unit and an amplification transistor, and a transistor having the same polarity as the amplification transistor. The amplification transistor has a first input node, a first primary node, and a second primary node, and the transistor having the same polarity as the amplification transistor has a second input node, a third primary node, and a fourth primary node. The first input node of the amplification transistor of each of the plurality of pixels is electrically connected to a signal line, and the signal line is electrically connected to a current source. The transistor may be provided for each signal line or each pixel. A power source voltage is supplied to the third primary node, the fourth primary node and the second primary node are electrically connected to each other, and the first primary node of the amplification transistor and the second input node of the transistor are electrically connected to each other. Therefore, the transistor supplies a voltage in accordance with the voltage of the first primary node of the amplification transistor to the second primary node of the amplification transistor and operates by a drive current by which the amplification transistor operates as a source follower.

The voltage of the input node and the voltage of the second primary node of the amplification transistor vary with a constant voltage difference. The capacitance between the input node and the second primary node of the amplification transistor can be substantially eliminated or significantly reduced, and a channel length modulation effect can be suppressed. This can increase the output gain and improve the signal-to-noise ratio. Further, since the transistor used for feedback operates by only the drive current of the amplification transistor, it is possible to increase the signal-to-noise ratio while suppressing increase in a consumption current.

Preferred embodiments of the present invention will now be described in detail in accordance with the accompanying drawings. The present invention is not limited to the embodiments described below. For example, a configuration of a part of any of the embodiments below may be added to another embodiment or replaced with a configuration of a part of another embodiment.

First Embodiment

Figure 1:
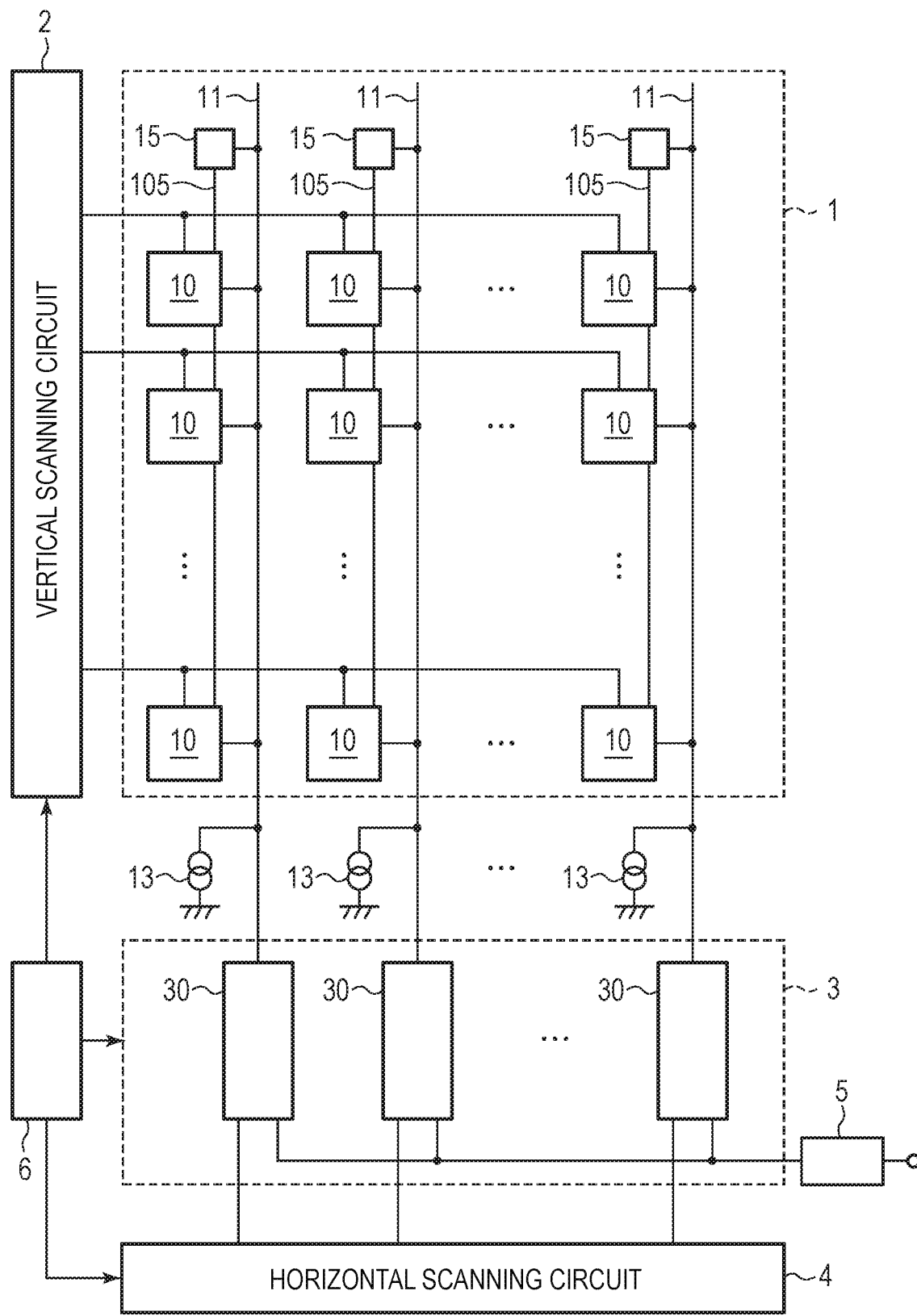
FIG. 1 is a block diagram of a solid state imaging device according to a first embodiment.

FIG. 1 is a block diagram of a solid state imaging device according to the present embodiment. The solid state imaging device is a Complementary Metal Oxide Semiconductor (CMOS) image sensor, for example, and has a pixel region 1, a vertical scanning circuit 2, a column circuit 3, a horizontal scanning circuit 4, an output circuit 5, a control circuit 6, column signal lines 11, and current sources 13.

The pixel region 1 has a plurality of pixels 10 aligned in a matrix, and each of the pixels 10 has a photoelectric conversion unit that generates and accumulates signal charges based on an incident light. Note that, in the present specification, the row direction as used herein indicates a horizontal direction in the drawings, and the column direction as used herein indicates a vertical direction in the drawings. On the pixels 10, micro lenses and color filters may be arranged. The color filters are primary color filters of red, blue, and green, for example, and are provided to respective pixels 10 according to the Bayer arrangement. Some of the pixels 10 are shielded from light as optical black pixels (OB pixels). The plurality of pixels 10 include focus detection pixels that output pixel signals used for focus detection are arranged and also have a plurality of imaging pixels that output pixel signals used for generating an image. Each column signal line 11 is provided on each column of the pixels 10, and each current source 13 is electrically connected to the column signal line 11. While each feedback circuit 15 is provided for each of the column signal lines 11 in the present embodiment, each feedback circuit 15 may be provided for each of pixel groups each including a plurality of pixels 10. The feedback circuit 15 supplies a voltage in accordance with a signal voltage on the column signal line 11 to the plurality of pixels 10 on each column via a voltage supply line 105.

The vertical scanning circuit 2 is formed of shift resistors, gate circuits, buffer circuits, and the like and outputs drive pulses to a row selectively based on a vertical synchronous signal, a horizontal synchronous signal, a clock signal, or the like. The drive pulses may be supplied on each row sequentially, or selectively. The column circuit 3 has signal processing circuits 30 for respective column signal lines 11. The signal processing circuit 30 has a differential amplifier circuit and a sample hold circuit and amplifies and temporarily holds a pixel signal output from the pixels 10 to the column signal line 11. The signal processing circuit 30 can perform correlated double sampling by calculating a difference between a pixel reset signal and the pixel photo-signal.

The horizontal scanning circuit 4 has a shift resistor and sequentially reads out pixel signals held in the signal processing circuits 30. The output circuit 5 might have a differential amplifier circuit, a buffer circuit, and a clamp circuit and outputs pixel signals read out from the horizontal scanning circuit 4 to the outside of the solid state imaging device. Such a configuration allows an incident light on the pixel region 1 via an optical system to output two-dimensional image electrical signals. Note that an analog-to-digital converter circuit may be provided to the output circuit 5 to output digital image signals. Alternatively, an analog-to-digital converter circuit may be provided on a column circuit. The control circuit 6 functions as a timing generator that generates various control signals and drive signals based on a clock, a synchronous signal, or the like.

Figure 2:
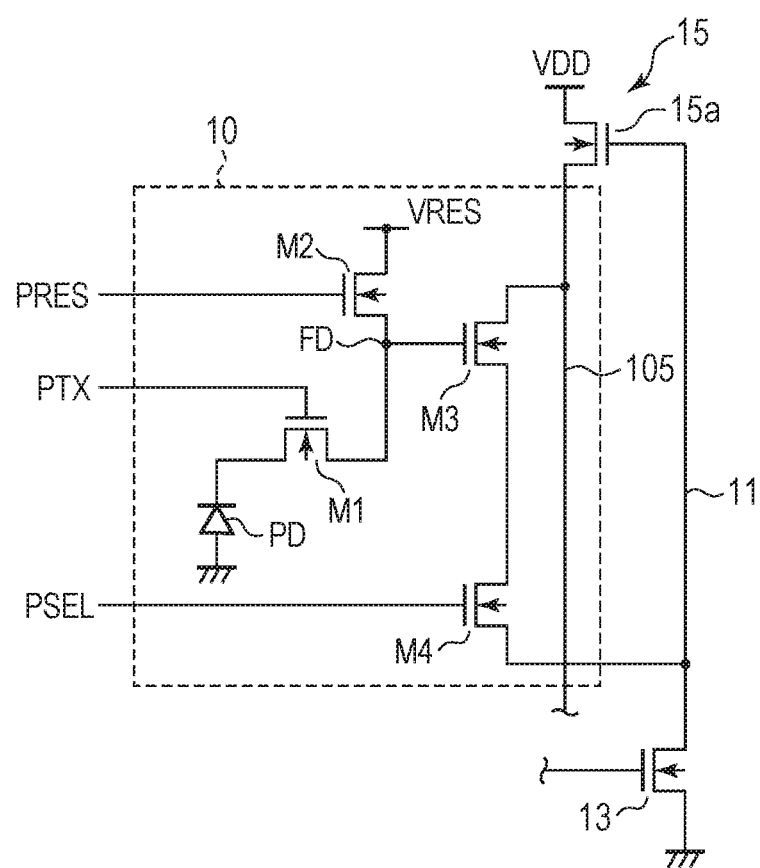
FIG. 2 is an equivalent circuit diagram of a pixel according to the first embodiment.

FIG. 2 is an equivalent circuit diagram of the pixel 10 according to the present embodiment. The pixel 10 includes a photoelectric conversion unit PD, a transfer transistor M1, a floating diffusion region FD, a reset transistor M2, an amplification transistor M3, and a selection transistor M4. In the description below, an example in which each transistor of the pixel 10 is an N-channel MOS transistor is illustrated. The photoelectric conversion unit PD is formed of a photodiode, for example, and performs photoelectric conversion of an incident light and accumulation of charges. Note that the photoelectric conversion unit PD may not be a photodiode, but be other photoelectric materials. Furthermore, when buried photodiode is formed, a dark current noise can be reduced. A micro lens is provided to the photoelectric conversion unit PD, and a light converged by the micro lens enters the photoelectric conversion unit PD.

The transfer transistor M1 is provided to the corresponding photoelectric conversion unit PD, and a drive pulse PTX is applied from the vertical scanning circuit 2 to the gate thereof. Once the drive pulse PTX becomes a high level, the transfer transistor M1 is turned on (conductive state), signal charges accumulated in the photoelectric conversion unit PD are transferred to the floating diffusion region FD formed at the gate (first input node) of the amplification transistor M3. Further, when the drive pulse PTX becomes a low level, the transfer transistor M1 is turned off (non-conductive state). Turning on and off of the transfer transistor M1 enables signal charges of the photoelectric conversion unit PD to be transferred to the floating diffusion region FD. The floating diffusion region FD converts signal charges to a signal voltage, and the amplification transistor M3 outputs a signal voltage in accordance with the gate voltage from the source (first primary node) to the column signal line 11 via the selection transistor M4.

The source of the reset transistor M2 is connected to the floating diffusion region FD, and a drive pulse PRES is applied to the gate from the vertical scanning circuit 2. Once the drive pulse PRES becomes a high level, the reset transistor M2 is turned on, and a reset voltage VRES is supplied to the floating diffusion region FD. The selection transistor M4 is provided between the amplification transistor M3 and the column signal line 11, and the drive pulse PSEL is applied to the gate of the selection transistor M4 from the vertical scanning circuit 2. Once the drive pulse PSEL becomes a high level, the amplification transistor M3 and the column signal line 11 are electrically conducted to each other. The current source 13 is electrically connected to the column signal line 11. The current source 13 is formed of a MOS transistor, the drain thereof is electrically connected to the column signal line 11, and the source thereof is electrically connected to a ground wiring. A predetermined potential is applied to the gate of the current source 13, and the current source 13 supplies a constant bias current to the source of the amplification transistor M3 via the column signal line 11.

The feedback circuit 15 is provided for each of the column signal lines 11 in the present embodiment and supplies, to the drain (second primary node) of the amplification transistor M3, a voltage that varies in accordance with a signal voltage output from the amplification transistor M3. The feedback circuit 15 is formed of an N-channel MOS feedback transistor 15a as an example, and the polarity of the feedback transistor 15a may be the same polarity as the polarity of the amplification transistor M3. In the feedback transistor 15a, the gate (second input node) is connected to the column signal line 11, the drain (third primary node) is connected to a power source wiring of a power source voltage VDD, and the source (fourth primary node) is connected to the drain of the amplification transistor M3 via the voltage supply line 105. In this way, the feedback transistor 15a is connected in series between the power source wiring and the drain of the amplification transistor M3. When the selection transistor M4 is in an on-state, a drive current is supplied from the current source 13 to the amplification transistor M3, and the feedback transistor 15a operates as a source follower by only the drive current supplied to the amplification transistor M3. The expression "by only the drive current" as used herein is to be understood in a substantial sense and is not intended to exclude a current component which is inevitable in semiconductor design, such as a leak current.

In this example, when the threshold voltage of the feedback transistor 15a is Vth1, the source voltage of the feedback transistor 15a, that is, the drain voltage VD of the amplification transistor M3 is lower by a sum of a voltage $\Delta V1$ and the threshold voltage Vth1 than the signal voltage of the column signal line 11. Therefore, the drain voltage VD is expressed by Equation 1, where a voltage V0 is the signal voltage of the column signal line 11 and the voltage $\Delta V1$ is a voltage that is determined by a current value supplied from the current source 13 and the conductance of the feedback transistor 15a.

$$VD = V0 - Vth1 - \Delta V1 \quad \text{(Equation 1)}$$

On the other hand, when the amplification transistor M3 operates as a source follower, the gate voltage VG and the drain voltage VD of the amplification transistor M3 vary with a constant difference voltage. Thus, the capacitance between the gate and the drain of the amplification transistor M3 becomes substantially zero or a significantly low value. Furthermore, since the voltage between the source and the drain of the amplification transistor M3 is constant regardless of the level of the signal voltage, a channel length modulation effect is suppressed, and the output gain of the source follower can be increased.

Further, in order that the amplification transistor M3 operates as a source follower, the following Equation 2 needs to be satisfied, where the threshold voltage of the amplification transistor M3 is denoted as Vth2, the drain voltage thereof is denoted as VD, and the gate voltage thereof is denoted as VG.

$$VD \leq VG - Vth2 \quad \text{(Equation 2)}$$

Furthermore, the signal voltage V0 of the column signal line 11 is expressed by the following Equation 3.

$$V0 = VG - Vth2 - \Delta V2 \quad \text{(Equation 3)}$$

In Equation 3, the value $\Delta V2$ is a voltage determined by a current value supplied from the current source 13, a conductance of the amplification transistor M3, and the on-resistance of the selection transistor M4. The following Equation 4 is derived from Equation 1 and Equation 3.

$$VD = VG - Vth2 - \Delta V2 - Vth1 - \Delta V1 \quad \text{(Equation 4)}$$

Therefore, the following Equation 5 is derived by substituting Equation 2, which relates to the source follower operation condition, for Equation 4.

$$VG - Vth2 - \Delta V2 - Vth1 - \Delta V1 \geq VG - Vth2 \quad \text{(Equation 5)}$$

Equation 5 is simplified to derive the following Equation 6.

$$-\Delta V2 - \Delta V1 \geq Vth1 \quad \text{(Equation 6)}$$

Since both $\Delta V1$ and $\Delta V2$ are positive values, the threshold voltage Vth1 is a negative value. In order that the amplification transistor M3 operates as a source follower, it is preferable that the feedback transistor 15a is a depression type and have the threshold voltage Vth1 satisfying the Equation 6.

Since the voltage V0 is the gate voltage of the feedback transistor 15a, it is preferable to satisfy the following Equation 7 to enable the feedback transistor 15a to operate as a source follower.

$$VDD \geq V0 - Vth1 \quad \text{(Equation 7)}$$

Equation 8 is derived from Equation 7 and Equation 3.

$$VDD \geq VG - Vth2 - \Delta V2 - Vth1 \quad \text{(Equation 8)}$$

Equation 8 is further expressed by Equation 9.

$$VG \leq VDD + Vth2 + Vth1 + \Delta V2 \quad \text{(Equation 9)}$$

The gate voltage VG of the amplification transistor M3 is reset to the reset voltage VRES, and thus Equation 9 is expressed by Equation 10.

$$VRES \leq VDD + Vth2 + Vth1 + \Delta V2 \quad \text{(Equation 10)}$$

As discussed above, when Equation 6 and Equation 10 are satisfied, the amplification transistor M3 operates as a source follower. Note that, for some values of the threshold voltages Vth1 and Vth2, it is preferable that the reset voltage VRES be set lower than the power source voltage VDD in Equation 10.

The general operation of a solid state imaging device configured as described above will be described. The vertical scanning circuit 2 turns the drive pulse PRES to a high level to reset charges of the floating diffusion region FD. The vertical scanning circuit 2 turns the drive pulse PRES to a low level to end the reset operation. A signal voltage in a reset state of the pixel 10 is output to the column signal line 11 and held in the capacitor of the signal processing circuit 30. Next, the vertical scanning circuit 2 turns the drive pulse PTX to a high level and then to a low level to transfers signal charges accumulated in the photoelectric conversion unit PD to the floating diffusion region FD. The potential of the floating diffusion region FD decreases by a predetermined voltage in accordance with a charge amount. A signal voltage based on signal charges of the floating diffusion region FD is output from the amplification transistor M3 to the column signal line 11. The signal voltage on the column signal line 11 is input to the gate of the feedback transistor 15a, the source potential of the feedback transistor 15a decreases by a predetermined potential in accordance with the signal voltage. As described above, when the amplification transistor M3 operates as a source follower, the gate voltage and the drain voltage of the amplification transistor M3 change with a constant voltage difference. A signal voltage at the time of photoelectric conversion is output from the source of the amplification transistor M3 to the column signal line 11 and held in the capacitor of the signal processing circuit 30. A comparator circuit of the signal processing circuit 30 outputs a differential signal of a signal voltage in reset information and the signal voltage at the time of photoelectric conversion, and thereby a signal from which a noise component has been removed can be obtained.

As described above, according to the present embodiment, the feedback circuit 15 supplies a voltage which varies in accordance with a signal voltage of the amplification transistor M3 to the drain of the amplification transistor M3. It is thus possible to substantially eliminate or significantly reduce a capacitance between the gate and the drain of the amplification transistor M3 and suppress a channel length modulation effect. This can increase the output gain and improve the signal-to-noise ratio. Further, since the feedback circuit 15 operates by only the drive current of the amplification transistor M3, it is possible to increase the signal-to-noise ratio without an increase in a consumption current.

Second Embodiment

Figure 3:
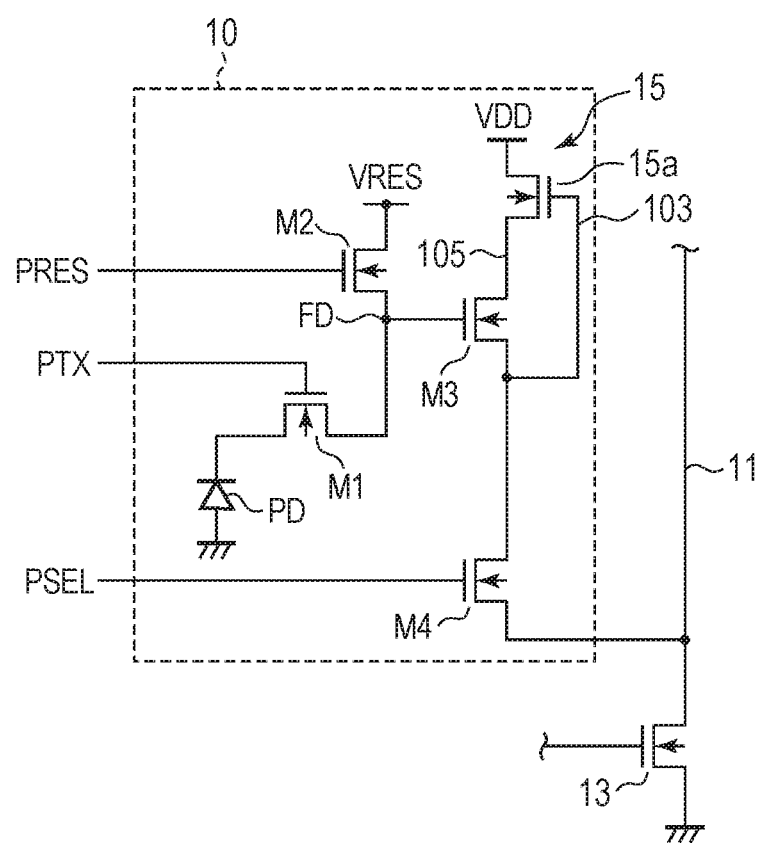
FIG. 3 is an equivalent circuit diagram of a pixel according to a second embodiment.

Next, a solid state imaging device according to a second embodiment of the present invention will be described mainly for configurations that are different from those of the first embodiment. FIG. 3 is an equivalent circuit diagram of the pixel 10 according to the present embodiment. In the present embodiment, the feedback circuit 15 is provided for each of the pixels 10. In the pixel 10, a single feedback transistor 15a is provided to the corresponding single amplification transistor M3, and the source of the feedback transistor 15a is connected to only the drain of the amplification transistor M3 via the voltage supply line 105. The gate of the feedback transistor 15a is connected to the source of the amplification transistor M3 via a wiring 103.

Also in the present embodiment, the feedback transistor 15a supplies, to the drain of the amplification transistor M3, a voltage which varies in accordance with a signal voltage output from the source of the amplification transistor M3. Thereby, it is possible to substantially eliminate or significantly reduce the capacitance between the gate and the drain of the amplification transistor M3 and increase the signal-to-noise ratio. Further, since the feedback circuit 15a operates by only the drive current of the amplification transistor M3, an increase in a consumption current can be suppressed.

Furthermore, in the present embodiment, the feedback transistor 15a is provided for each pixel 10, and the drain of a single amplification transistor M3 is connected to the voltage supply line 105 from the feedback transistor 15a. Thus, compared to the first embodiment, the capacitance in the voltage supply line 105 can be reduced, and the delay time in feedback can be significantly reduced.

Further, in the present embodiment, the feedback signal voltage is not the signal voltage of the column signal line 11 but the signal voltage of the source of the amplification transistor M3. Thus, in Equation 6 ($-\Delta V2-\Delta V1 \geq Vth1$) described above, the value of $\Delta V2$ is smaller by a voltage drop due to the on-resistance of the selection transistor M4 than the value of $\Delta V2$ in the first embodiment. Therefore, the condition required to be satisfied by the threshold voltage Vth1 of the feedback transistor 15a is mitigated compared to the first embodiment, which can increase flexibility in design.

Figure 4:
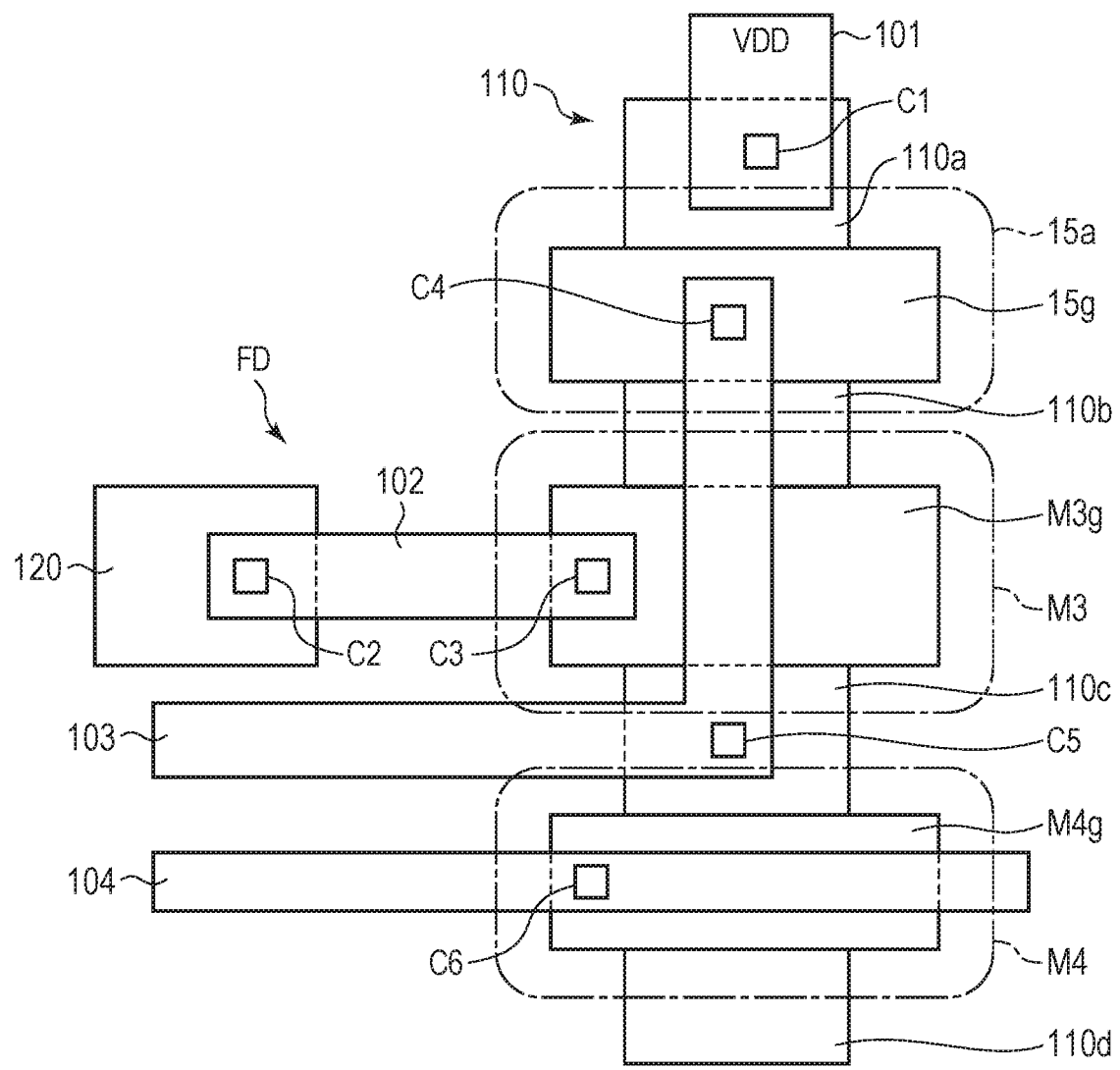
FIG. 4 is a plan view of the pixel according to the second embodiment.

FIG. 4 is a plan view of a pixel according to the present embodiment. In FIG. 4, the components corresponding to the circuit elements in FIG. 3 are labeled with the same reference numerals. Thin gate oxidation films are formed on the active regions 110 and 120, and element isolation regions covered with thick oxidized films are formed in regions other than active regions 110 and 120.

A source region of the transfer transistor M1 is formed in the active region 120, and the source region forms the floating diffusion region FD that holds signal charges transferred from the photoelectric conversion unit PD. The floating diffusion region FD is connected to one end of a wiring 102 via a contact hole C2. The other end of the wiring 102 is connected to the gate electrode M3g of the amplification transistor M3 via a contact hole C3.

In the active region 110, a gate electrode M3g of the amplification transistor M3 is formed via an insulating layer on a channel region between a region 110b and a region 110c. The region 110c serves as both a source region of the amplification transistor M3 and a drain region of the selection transistor M4. A gate electrode M4g of the selection transistor M4 is formed via an insulating layer on a channel region between a region 110c and a region 110d. The gate electrode M4g is connected to a drive wiring 104 via a contact hole C6. The region 110d forms the source region of a selection transistor M4 and is connected to the column signal line 11 (not illustrated). Furthermore, in the active region 110, a gate electrode 15g of the feedback transistor 15a is formed via an insulating layer on a channel region between the region 110a and the region 110b. The gate electrode 15g is connected to the wiring 103 via a contact hole C4. The wiring 103 is further connected to the region 110c, that is, the source region of the amplification transistor M3 and the drain region of the selection transistor M4 via a contact hole C5. The region 110a forms a drain region of the feedback transistor 15a and is connected to a power source wiring 101 via a contact hole C1. The region 110b serves as both a source region of a feedback transistor 15a and a drain region of the amplification transistor M3.

In FIG. 4, the wiring (first wiring) 103 intersects with the gate electrode M3g of the amplification transistor M3 and neighbors the wiring (second wiring) 102 and the floating diffusion region FD. However, the capacitance among the wiring 103, the gate electrode M3g, the wiring 102, and the floating diffusion region FD is substantially eliminated or significantly reduced because the wiring 103 is the output of the amplification transistor M3. Further, at least a part of the wiring 103 is located between the wiring 102 and the drive wiring (third wiring) 104 in a planar view, and thereby the capacitance between the drive wiring 104 and the wiring 102 is reduced by an electrical shield effect. On the drive wiring of the transfer transistor M1 and the drive wiring of the reset transistor M2, the capacitance with respect to the wiring 102 can be reduced in the same manner as on the drive wiring 104 of the selection transistor M4. Furthermore, although not illustrated, a wiring in an upper layer connected to the wiring 103 may be arranged to cover the most part of the floating diffusion region FD and the wiring 102. This can reduce the capacitance among the floating diffusion region FD, the wiring 102, the gate electrode M3g and the drive wiring thereto, the power source wiring 101, and the like by an electrical shielding effect.

As described above, according to the present embodiment, it is possible to increase the signal-to-noise ratio while suppressing an increase in a consumption current. Further, since the feedback circuit 15 is provided on a pixel 10 basis, the capacitance on the voltage supply line 105 can be reduced, and the delay time of feedback can be significantly reduced compared to the first embodiment.

Third Embodiment

Figure 5:
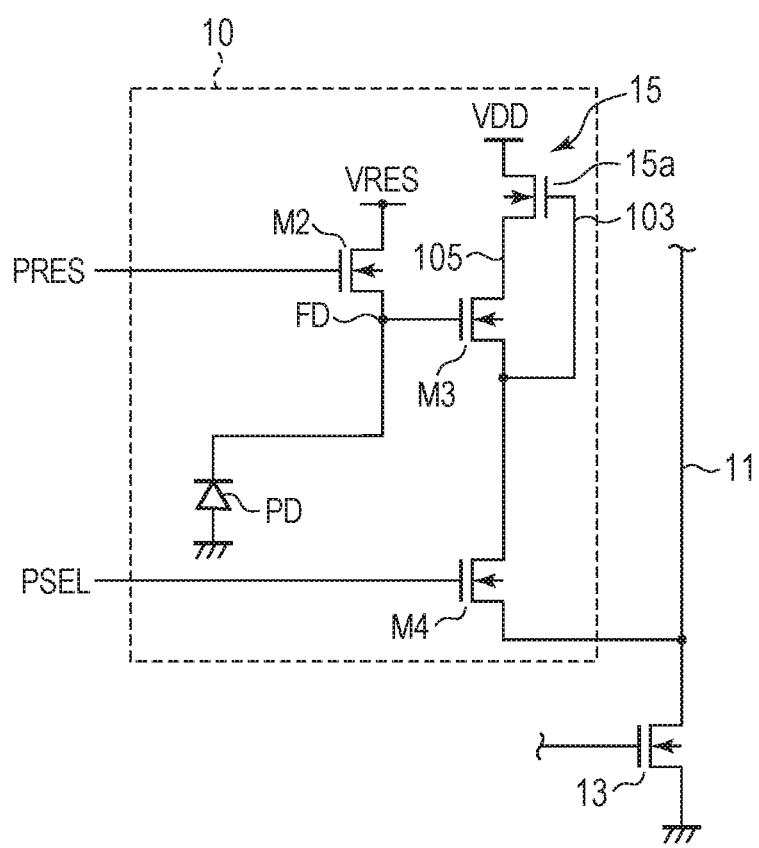
FIG. 5 is an equivalent circuit diagram of a pixel according to a third embodiment.

Next, a solid state imaging device according to a third embodiment of the present invention will be described mainly for configurations that are different from those of the second embodiment. FIG. 5 is an equivalent circuit diagram of the pixel 10 according to the present embodiment. In the present embodiment, the pixel 10 does not have the transfer transistor M1, and an N-electrode of the photoelectric conversion unit PD forms the floating diffusion region FD. In the pixel 10 having such a configuration, unlike the first and second embodiments, noise removal by using correlated double sampling cannot be performed. In this case, a circuit that feeds back a signal voltage of the amplification transistor M3 to the reset voltage VRES may be provided.

Also in the present embodiment, the feedback circuit 15 that operates by only the drive current used for causing the amplification transistor M3 to operate as a source follower is used, it is possible to increase the signal-to-noise ratio while suppressing an increase in a consumption current.

Fourth Embodiment

Figure 6:
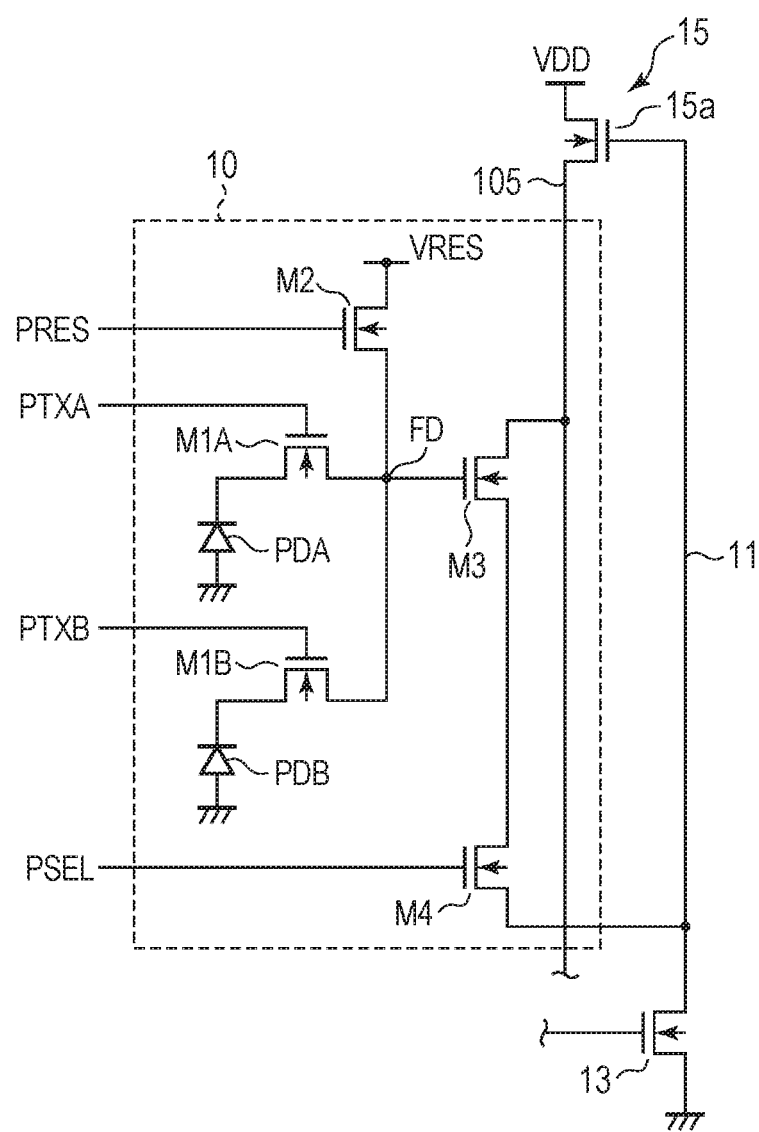
FIG. 6 is an equivalent circuit diagram of a pixel according to a fourth embodiment.

Next, a solid state imaging device according to a fourth embodiment of the present invention will be described mainly for configurations that are different from those of the first embodiment. FIG. 6 is an equivalent circuit diagram of the pixel 10 according to the present embodiment. The pixel 10 includes photoelectric conversion units PDA and PDB, transfer transistors M1A and M1B, the floating diffusion region FD, the reset transistor M2, the amplification transistor M3, and the selection transistor M4. Each of the photoelectric conversion units PDA and PDB is formed of a photodiode, for example, and performs photoelectric conversion by an incident light and accumulation of charges. The photoelectric conversion units PDA and PDB are provided with a common micro lens, a light converged by the micro lens enters the photoelectric conversion units PDA and PDB. In such a way, the photoelectric conversion unit is pupil-divided as PDA and PDB. Note that the number of photoelectric conversion units forming the pixel 10 is not limited to two but may be more than two.

The transfer transistors M1A and M1B are provided to the photoelectric conversion units PDA and PDB, respectively, and drive pulses PTXA and PTXB are applied to the respective gates. Once the drive pulses PTXA and PTXB become a high level, the transfer transistors MIA and M1B are turned on (conductive state), and signals of the photoelectric conversion units PDA and PDB are transferred to the floating diffusion region FD that is the input node of the amplification transistor M3. Further, when the drive pulses PTXA and PTXB become a low level, the transfer transistors MIA and M1B are turned off (non-conductive state). Simultaneous turning on or off of the transfer transistors M1A and M1B enables signal charges of the photoelectric conversion units PDA and PDB to be transferred to the floating diffusion region FD. The amplification transistor M3 outputs, from the source thereof, a signal voltage in accordance with signal charges added in the floating diffusion region FD. Further, the drive pulse PTXA is turned on or off, signal charges of the photoelectric conversion unit PDA are transferred to the floating diffusion region FD, and the amplification transistor M3 outputs a signal voltage in accordance with signal charges from the source thereof. According to the configuration described above, a (A+B) signal in which respective signal charges of the photoelectric conversion units PDA and PDB are added and an A-signal of the photoelectric conversion unit PDA can be obtained. The (A+B) signal is used as an image signal. A B-signal of the photoelectric conversion unit PDB can be calculated by subtracting the A-signal from the (A+B) signal. Note that, instead of subtraction, signal charges from the photoelectric conversion unit PDB may be independently read out. The A-signal and the B-signal are used as focus detection signals for phase different detection.

The feedback circuit 15 is provided for each of the column signal lines 11 in the same manner as the first embodiment and supplies, to the drain of the amplification transistor M3 via the voltage supply line 105, a voltage which varies in accordance with a signal voltage output from the amplification transistor M3. Further, the feedback transistor 15a is connected in series between the power source wiring of the power source voltage VDD and the drain of the amplification transistor M3 and operates as a source follower by only the drive current supplied to the amplification transistor M3.

Also in the present embodiment, it is possible to substantially eliminate or significantly reduce the capacitance of the floating diffusion region FD in the pupil-divided pixel 10 and increase the signal gain. Further, since the feedback circuit operates by only the drive current of the amplification transistor, it is possible increase the signal-to-noise ratio while suppressing an increase in a consumption current.

Fifth Embodiment

Figure 7:
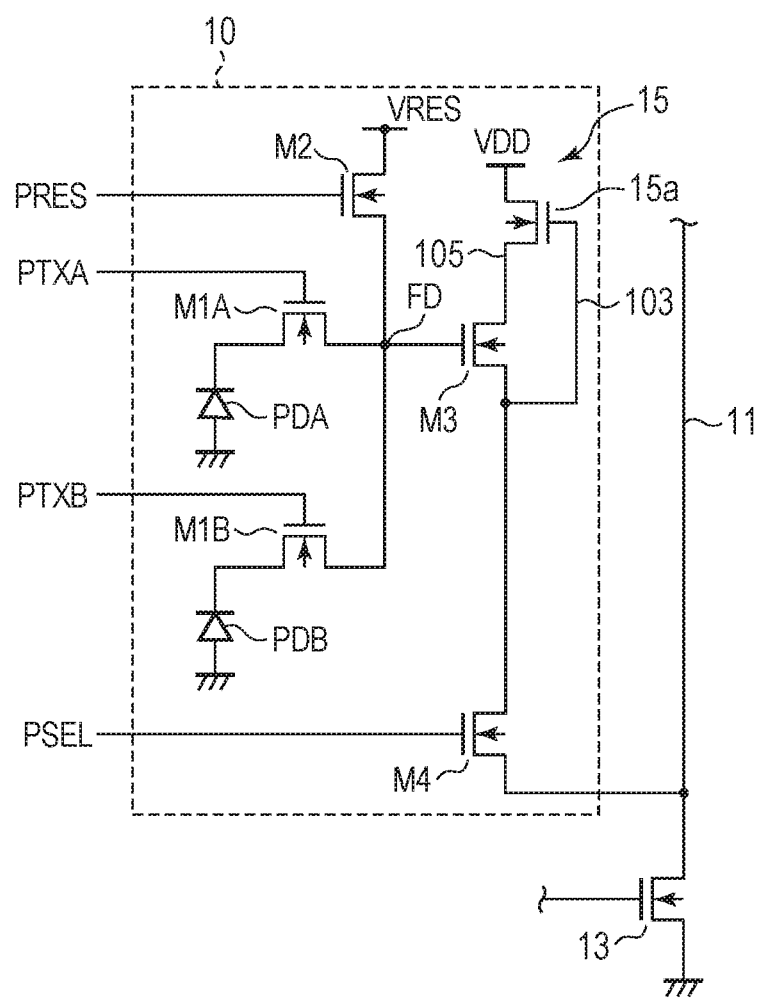
FIG. 7 is an equivalent circuit diagram of a pixel according to a fifth embodiment.

Next, a solid state imaging device according to a fifth embodiment of the present invention will be described mainly for configurations that are different from those of the fourth embodiment. FIG. 7 is an equivalent circuit diagram of the pixel 10 according to the present embodiment. The feedback circuit 15 is provided on a pixel 10 basis. In the pixel 10, a single feedback transistor 15a is provided to the corresponding single amplification transistor M3, and the source of the feedback transistor 15a is connected to only the drain of the amplification transistor M3 via the voltage supply line 105. Also in the present embodiment, it is possible to substantially eliminate or significantly reduce the capacitance of the floating diffusion region FD in the pupil-divided pixel 10 and increase the output gain of a signal voltage. Further, since the feedback circuit operates by only the drive current of the amplification transistor, it is possible increase the signal-to-noise ratio while suppressing an increase in a consumption current.

Sixth Embodiment

Figure 8:
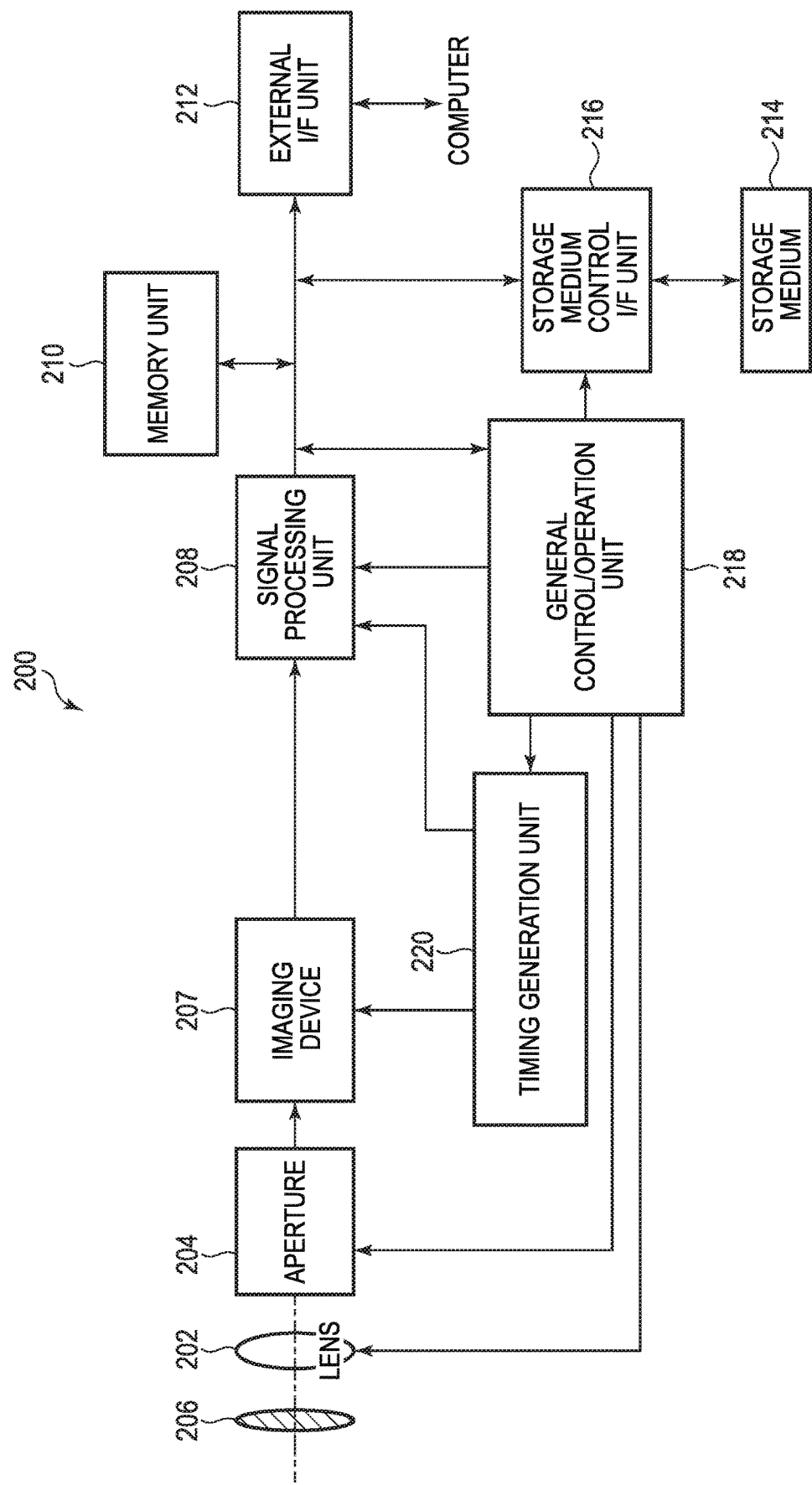
FIG. 8 is a block diagram of an imaging system according to a sixth embodiment.

The solid state imaging devices according to the embodiments described above can be applied to various imaging system. Such an imaging system may be a digital still camera, a digital camcorder, a camera head, a copier machine, a fax machine, a mobile phone, an on-vehicle camera, an observation satellite, a surveillance camera, or the like. FIG. 8 illustrates a block diagram of a digital still camera as an example of the imaging system.

The imaging system illustrated in FIG. 8 includes a barrier 206, a lens 202, an aperture 204, an imaging device 207, a signal processing unit 208, a timing generation unit 220, a general control/operation unit 218, a memory unit 210, a storage medium control I/F unit 216, a storage medium 214, and an external I/F unit 212. The barrier 206 protects the lens 202, and the lens 202 captures an optical image of a subject on the imaging device 207. The aperture 204 changes an amount of a light that has passed through the lens 202. The imaging device 207 includes any one of the solid state imaging devices of the embodiments described above and converts the optical image captured by the lens 202 into image data. In this example, an analog-to-digital (AD) conversion unit is formed on a semiconductor substrate of the imaging device 207. The signal processing unit 208 performs various correction or data compression on the captured data output from the imaging device 207. The timing generation unit 220 outputs various timing signals to the imaging device 207 and the signal processing unit 208. The general control/operation unit 218 controls the entire digital still camera, and the memory unit 210 temporarily stores image data. The storage medium control I/F unit 216 is an interface used for storage or readout of image data to or from the storage medium 214, and the storage medium 214 is a removable storage medium such as a semiconductor memory or the like used for storage or readout of captured data. The external I/F unit 212 is an interface used for communicating with an external computer or the like. The timing signal or the like may be input from the outside of the imaging system, and the imaging system may have at least the imaging device 207 and the signal processing unit 208 that processes a captured signal output from the imaging device 207.

In the present embodiment, the configuration in which the imaging device 207 and the AD conversion unit are provided on different semiconductor substrates has been described. However, the imaging device 207 and the AD conversion unit may be formed on the same semiconductor substrate. Further, the imaging device 207 and the signal processing unit 208 may be formed on the same semiconductor substrate.

Further, each of the pixels may have the first photoelectric conversion unit and the second photoelectric conversion unit. The signal processing unit 208 may be configured to process a pixel signal based on charges generated by the first photoelectric conversion unit and a pixel signal based on charges generated by the second photoelectric conversion unit and acquire distance information on the distance from the imaging device 207 to a subject.

Seventh Embodiment

Figure 9A:
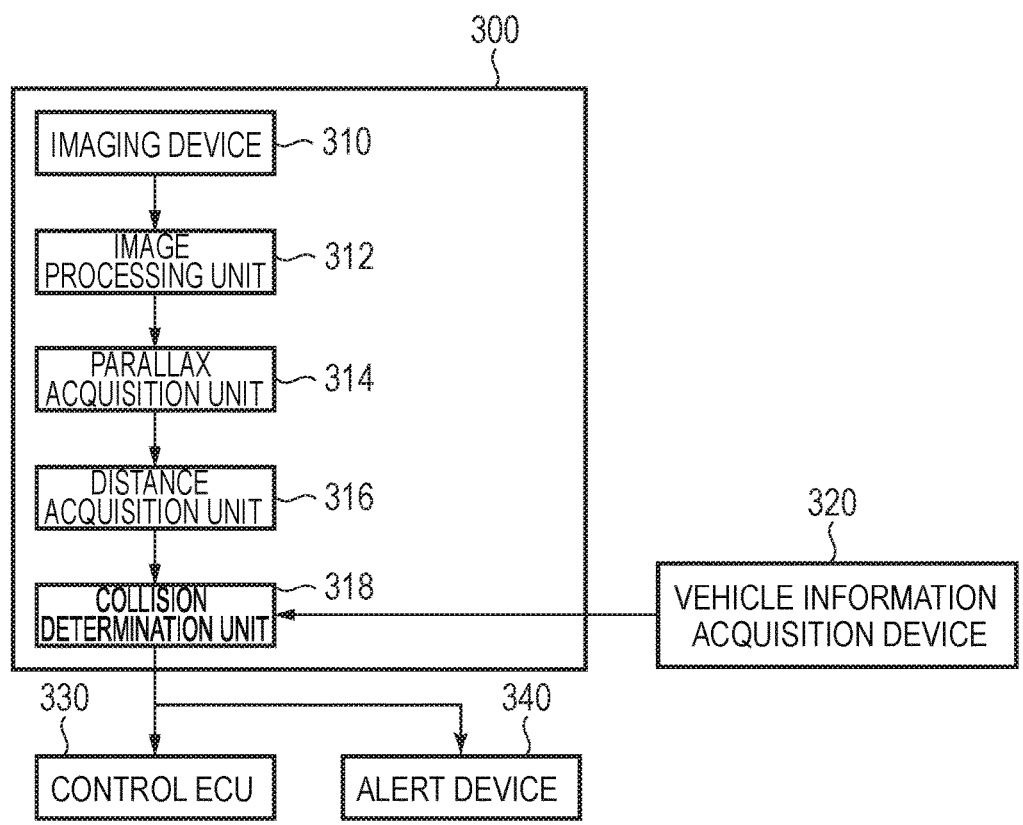
FIG. 9A and FIG. 9B are block diagrams of an imaging system of an on-vehicle camera according to a seventh embodiment.
Figure 9B:
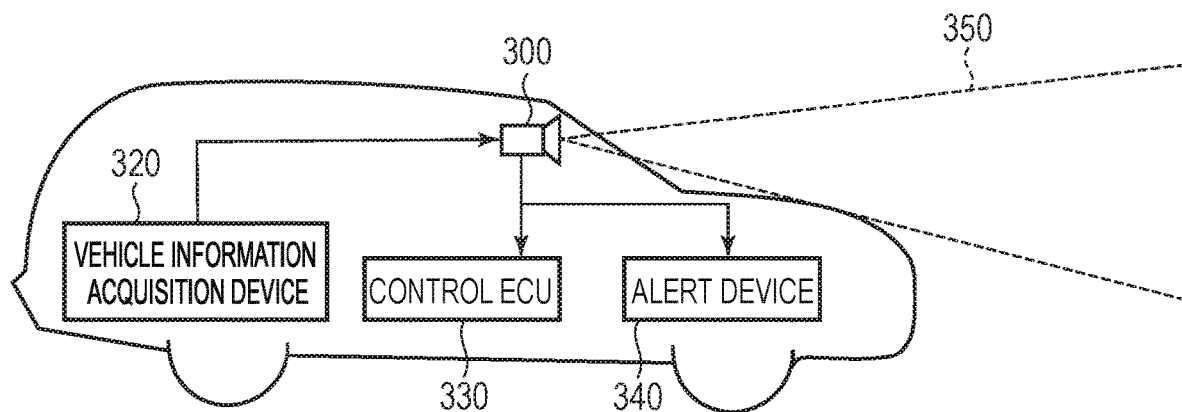

FIG. 9A and FIG. 9B illustrate an example of the imaging system related to an on-vehicle camera according to a seventh embodiment of the present invention. The imaging system 300 has an imaging device 310 of any one of the embodiments described above. The imaging system 300 has an image processing unit 312 that performs image processing on a plurality of image data acquired by the imaging device 310 and a parallax acquisition unit 314 that calculates a parallax (a phase difference of parallax images) from the plurality of image data acquired by the imaging system 300. Further, the imaging system 300 has a distance acquisition unit 316 that calculates a distance to the object based on the calculated parallax and a collision determination unit 318 that determines whether or not there is a collision possibility based on the calculated distance. Here, the parallax acquisition unit 314 and the distance acquisition unit 316 are an example of a distance information acquisition unit that acquires distance information on the distance to the object. That is, the distance information is information on a parallax, a defocus amount, a distance to an object, or the like. The collision determination unit 318 may use any of the distance information to determine the collision possibility. The distance information acquisition unit may be implemented by dedicatedly designed hardware or may be implemented by a software module. Further, the distance information acquisition unit may be implemented by a Field Programmable Gate Array (FPGA) or an Application Specific Integrated Circuit (ASIC) or may be implemented by combination thereof.

The imaging system 300 is connected to the vehicle information acquisition device 320 and can acquire vehicle information such as a vehicle speed, a yaw rate, a steering angle, or the like. Further, the imaging system 300 is connected with a control ECU 330, which is a control device that outputs a control signal for causing a vehicle to generate braking force based on a determination result by the collision determination unit 318. Further, the imaging system 300 is connected with an alert device 340 that issues an alert to the driver based on a determination result by the collision determination unit 318. For example, when the collision probability is high as the determination result of the collision determination unit 318, the control ECU 330 performs vehicle control to avoid a collision or reduce damage by applying a brake, pushing back an accelerator, suppressing engine power, or the like. The alert device 340 alerts a user by sounding an alert such as a sound, displaying alert information on a display of a car navigation system or the like, providing vibration to a seat belt or a steering wheel, or the like. The imaging system 300 functions as a control unit that controls the operation of controlling a vehicle as described above.

In the present embodiment, an area around a vehicle, for example, a front area or a rear area is captured by using the imaging system 300. FIG. 9B illustrates the imaging system in a case of capturing a front area of a vehicle (a capturing area 350). The vehicle information acquisition device 320 as an imaging control unit transmits instructions to the imaging system 300 or the imaging device 310 to perform the operation described in the above first to sixth embodiments. Since the operation of the imaging device 310 is the same as that in the first to sixth embodiments, the description thereof is omitted here. Such a configuration can further improve the ranging accuracy.

Although the example of control for avoiding a collision to another vehicle has been illustrated in the above description, the embodiment is applicable to automatic driving control for following another vehicle, automatic driving control for not going out of a traffic lane, or the like. Furthermore, the imaging system is not limited to a vehicle such as the subject vehicle, and can be applied to a moving unit (moving apparatus) such as a ship, an airplane, or an industrial robot, for example. In addition, the imaging system can be widely applied to a device which utilizes object recognition, such as an intelligent transportation system (ITS), without being limited to moving units.

Other Embodiments

The present invention is not limited to the embodiments described above, and various modification are possible. For example, embodiments of the present invention include an example in which a configuration of a part of any of the embodiments is added to another embodiment or an example in which a configuration of a part of any of the embodiments is replaced with a configuration of a part of another embodiment.

While the configurations in which a single pixel has a single amplification transistor have been described in the embodiments described above, the present invention is not limited to these configurations. For example, when a single pixel has a plurality of amplification transistors provided to a plurality of photoelectric conversion units, respectively, the feedback transistor may be provided on an amplification transistor basis.

While the case where each transistor is formed of an N-type transistor has been considered and described in the above embodiments, each transistor may be formed of a P-type transistor. In this case, the level of each drive signal described above will be opposite.

Note that each of the embodiments described above merely illustrates an embodied example in implementing the present invention, and the technical scope of the present invention is not to be construed by these embodiments. That is, the present invention can be implemented in various forms without departing from the technical concept thereof or the primary features thereof.

Advantage of the Invention

According to the present invention, it is possible to improve the signal-to-noise ratio while suppressing an increase in a consumption current.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2017-195154, filed Oct. 5, 2017, which is hereby incorporated by reference herein in its entirety.

What is claimed is:

1. A solid state imaging device comprising:
a plurality of pixels each comprising at least one photoelectric conversion unit and an amplification transistor having a first input node electrically connected to the photoelectric conversion unit, a first primary node, and a second primary node;
a first transistor having a second input node, a third primary node, and a fourth primary node and having the same polarity as the amplification transistor;
at least one signal line to which the first primary node of each of the plurality of pixels is electrically connected; and
a current source electrically connected to the signal line,
wherein a power source voltage is applied to the third primary node, the fourth primary node and the second primary node are electrically connected to each other, and the first primary node and the second input node are electrically connected to each other, and
wherein a first wiring that electrically connects the first primary node of the amplification transistor to the second input node of the first transistor intersects with at least a part of an electrode of the first input node of the amplification transistor in a planar view.

2. The solid state imaging device according to claim 1, wherein each of the plurality of pixels has the first transistor.

3. The solid state imaging device according to claim 2, wherein each of the plurality of pixels further comprises:
a selection transistor provided between the first primary node of the amplification transistor and the signal line;
a floating diffusion region electrically connected to the photoelectric conversion unit;
a second wiring that electrically connects the floating diffusion region to the first input node of the amplification transistor; and
a third wiring electrically connected to an input node of the selection transistor,
wherein at least a part of the first wiring is located between the second wiring and the third wiring in a planar view.

4. A solid state imaging device comprising:
a plurality of pixels each comprising at least one photoelectric conversion unit and an amplification transistor having a first input node electrically connected to the photoelectric conversion unit, a first primary node, and a second primary node;
a first transistor having a second input node, a third primary node, and a fourth primary node and having the same polarity as the amplification transistor;
at least one signal line to which the first primary node of each of the plurality of pixels is electrically connected;
a current source electrically connected to the signal line; and
a feedback circuit operated by a drive current supplied from the current source,
wherein a first wiring that electrically connects the first primary node of the amplification transistor to the second input node of the first transistor intersects with at least a part of an electrode of the first input node of the amplification transistor in a planar view.

5. The solid state imaging device according to claim 4, wherein the feedback circuit is provided for each of the pixels.

6. The solid state imaging device according to claim 5, wherein each of the plurality of pixels further comprises:
a selection transistor provided between the first primary node of the amplification transistor and the signal line;
a floating diffusion region electrically connected to the photoelectric conversion unit;
a second wiring that electrically connects the floating diffusion region to the first input node of the amplification transistor; and
a third wiring electrically connected to an input node of the selection transistor,
wherein at least a part of the first wiring is located between the second wiring and the third wiring in a planar view.

7. A solid state imaging device comprising:
a plurality of pixels each comprising at least one photoelectric conversion unit and an amplification transistor having a first input node electrically connected to the photoelectric conversion unit, a first primary node, and a second primary node;
a first transistor having a second input node, a third primary node, and a fourth primary node and having the same polarity as the amplification transistor;
at least one signal line to which the first primary node of each of the plurality of pixels is electrically connected; and
a current source electrically connected to the signal line,
wherein a power source voltage is applied to the third primary node, the fourth primary node and the second primary node are electrically connected to each other, and the first primary node and the second input node are electrically connected to each other, and
further comprising a reset transistor that resets the first input node of the amplification transistor to a reset voltage, wherein $$-\Delta V2 - \Delta V1 \geq Vth1$$

is satisfied, where a threshold voltage of the first transistor is $Vth1$, a voltage determined by a current value and a conductance of the first transistor is $\Delta V1$, and a voltage determined by a current value and a conductance of the amplification transistor is $\Delta V2$.

8. The solid state imaging device according to claim 7, wherein each of the plurality of pixels has the first transistor.

9. The solid state imaging device according to claim 8, wherein a first wiring that electrically connects the first primary node of the amplification transistor to the second input node of the first transistor intersects with at least a part of an electrode of the first input node of the amplification transistor in a planar view.

10. The solid state imaging device according to claim 9, wherein each of the plurality of pixels further comprises:
a selection transistor provided between the first primary node of the amplification transistor and the signal line;
a floating diffusion region electrically connected to the photoelectric conversion unit;
a second wiring that electrically connects the floating diffusion region to the first input node of the amplification transistor; and
a third wiring electrically connected to an input node of the selection transistor,
wherein at least a part of the first wiring is located between the second wiring and the third wiring in a planar view.

11. A solid state imaging device comprising:
a plurality of pixels each comprising at least one photoelectric conversion unit and an amplification transistor having a first input node electrically connected to the photoelectric conversion unit, a first primary node, and a second primary node;
a first transistor having a second input node, a third primary node, and a fourth primary node and having the same polarity as the amplification transistor;
at least one signal line to which the first primary node of each of the plurality of pixels is electrically connected;
a current source electrically connected to the signal line; and
a feedback circuit operated by a drive current supplied from the current source,
wherein the current source supplies a drive current to the amplification transistor,
wherein the feedback circuit comprises the first transistor,
wherein the second input node of the first transistor is electrically connected to the first primary node of the amplification transistor, the fourth primary node of the first transistor is electrically connected to the second primary node of the amplification transistor, and a power source voltage is applied to the third primary node of the first transistor,
wherein the first transistor performs a source follower operation,
wherein a polarity of the first transistor is the same as a polarity of the amplification transistor, and the first transistor is of a depression type,
further comprising a reset transistor that resets the first input node of the amplification transistor to a reset voltage, wherein $-\Delta V2 - \Delta V1 \geq Vth1$ is satisfied, where a threshold voltage of the first transistor is Vth1, a voltage determined by a current value and a conductance of the first transistor is $\Delta V1$, and a voltage determined by a current value and a conductance of the amplification transistor is $\Delta V2$.

12. The solid state imaging device according to claim 11, wherein the feedback circuit is provided for each of the pixels.

13. The solid state imaging device according to claim 12, wherein a first wiring that electrically connects the first primary node of the amplification transistor to the second input node of the first transistor intersects with at least a part of an electrode of the first input node of the amplification transistor in a planar view.

14. The solid state imaging device according to claim 13, wherein each of the plurality of pixels further comprises:
a selection transistor provided between the first primary node of the amplification transistor and the signal line;
a floating diffusion region electrically connected to the photoelectric conversion unit;
a second wiring that electrically connects the floating diffusion region to the first input node of the amplification transistor; and
a third wiring electrically connected to an input node of the selection transistor,
wherein at least a part of the first wiring is located between the second wiring and the third wiring in a planar view.

* * * * *